United States Patent
Wang et al.

(10) Patent No.: US 11,037,857 B1
(45) Date of Patent: Jun. 15, 2021

(54) IGBT MODULE WITH HEAT DISSIPATION STRUCTURE HAVING COPPER LAYERS OF DIFFERENT THICKNESSES

(71) Applicant: AMULAIRE THERMAL TECHNOLOGY, INC., New Taipei (TW)

(72) Inventors: Tzu-Hsuan Wang, New Taipei (TW); Tze-Yang Yeh, New Taipei (TW); Chun-Lung Wu, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 0 days.

(21) Appl. No.: 16/711,747

(22) Filed: Dec. 12, 2019

(51) Int. Cl.
H01L 23/373 (2006.01)
H01L 25/07 (2006.01)
H01L 23/00 (2006.01)
H01L 25/18 (2006.01)

(52) U.S. Cl.
CPC .......... *H01L 23/3735* (2013.01); *H01L 24/32* (2013.01); *H01L 25/072* (2013.01); *H01L 25/18* (2013.01); H01L 2224/32245 (2013.01)

(58) Field of Classification Search
CPC ..... H01L 23/3735; H01L 25/18; H01L 24/32; H01L 25/072; H01L 2224/32245
USPC .......................................................... 257/741
See application file for complete search history.

(56) References Cited

U.S. PATENT DOCUMENTS

| | | | |
|---|---|---|---|
| 8,564,957 B2 * | 10/2013 | Usui ................. | H05K 7/20509 361/720 |
| 2014/0353818 A1* | 12/2014 | Geitner ............ | H01L 23/49575 257/734 |
| 2018/0084635 A1* | 3/2018 | Palaniswamy ......... | H05K 1/189 |

* cited by examiner

*Primary Examiner* — Vu A Vu
(74) *Attorney, Agent, or Firm* — Li & Cai Intellectual Property (USA) Office

(57) ABSTRACT

An IGBT module with a heat dissipation structure includes a first layer of chips, a second layer of chips, a first bonding layer, a second bonding layer, a first copper layer, a second copper layer, a thermally-conductive and electrically-insulating layer, and a heat dissipation layer. The first copper layer and the second copper layer are disposed on the thermally-conductive and electrically-insulating layer at intervals. The first layer of chips and the second layer of chips are disposed on the first bonding layer and the second bonding layer, respectively. The number of chips of the first layer of chips is larger than that of the second layer of chips such that the first copper layer has a greater thickness than the second copper layer.

3 Claims, 3 Drawing Sheets

IGBT MODULE WITH HEAT DISSIPATION STRUCTURE HAVING COPPER LAYERS OF DIFFERENT THICKNESSES

FIELD OF THE DISCLOSURE

The present disclosure relates to an IGBT (Insulated Gate Bipolar Transistor) module, and more particularly to an IGBT module with a heat dissipation structure having copper layers of different thicknesses.

BACKGROUND OF THE DISCLOSURE

Most high-power inverters currently used in electric vehicles/hybrid vehicles adopt IGBT (Insulated Gate Bipolar Transistor) chips. Therefore, the heat generated by the high-power inverters during operation will cause the IGBT chip temperature to rise. If no proper heat dissipation measures are incorporated, the temperature of the IGBT chip may exceed the allowable temperature, resulting in deterioration of performance and damage. Therefore, the IGBT heat dissipating efficiency has become a major problem in the industry.

At present, the direct bonded copper (DBC) substrate has become the material of choice for IGBT heat dissipation structures. Referring to FIG. 1 and FIG. 2, the conventional IGBT module with the heat dissipation structure mainly includes a layer 11A of IGBT chips, an upper solder layer 12A, a DBC substrate 13A, a lower solder layer 14A, and a heat dissipation layer 15A. Among them, the DBC substrate 13A includes, from top to bottom, an upper metal layer 131A, a ceramic layer 132A, and a lower metal layer 133A. However, the DBC substrate is of a multilayer structure which has a limited ability of spreading heat. When heat is generated by the layer of IGBT chips, it cannot be transferred to the heat dissipation metal layer through the DBC substrate in time. Moreover, the connection between the DBC substrate and the heat dissipation metal layer can only be made through the solder layer. In practice, the entire solder layer is highly prone to experience an empty soldering phenomenon and causes an increase in interface impedance, thereby affecting the effectiveness of thermal conductivity.

SUMMARY OF THE DISCLOSURE

One objective of the present disclosure is to provide an IGBT module with a heat dissipation structure having copper layers of different thicknesses that can overcome the aforementioned issues.

In one aspect, the present disclosure provides an IGBT module with a heat dissipation structure, including a first layer of chips, a second layer of chips, a first bonding layer, a second bonding layer, a first copper layer, a second copper layer, a thermally-conductive and electrically-insulating layer, and a heat dissipation layer. The thermally-conductive and electrically-insulating is disposed on the heat dissipation layer, the first copper layer and the second copper layer are disposed on the thermally-conductive and electrically-insulating layer at intervals. The first bonding layer and the second bonding layer are disposed on the first copper layer and the second copper layer, respectively. The first layer of chips and the second layer of chips are disposed on the first bonding layer and the second bonding layer, respectively. The number of chips of the first layer of chips is larger than that of the second layer of chips such that the first copper layer has a greater thickness than the second copper layer.

Preferably, the first copper layer has a thickness greater than 1000 µm.

Preferably, the second copper layer has a thickness of 200-1000 µm.

Preferably, the thermally-conductive and electrically-insulating layer is an epoxy-based composite, a polyimide-based composite or a PP-based composite.

Preferably, the thermally-conductive and electrically-insulating layer includes at least one of the following fillers: alumina, aluminum nitride, silicon nitride, silicon carbide, or boron nitride.

Preferably, the IGBT module with the heat dissipation structure further includes a third layer of chips, a third bonding layer and a third copper layer. The third copper layer, the first copper layer and the second copper layer are disposed on the thermally-conductive and electrically-insulating layer at intervals. The third bonding layer is disposed on the third copper layer, and the third layer of chips is disposed on the third bonding layer. The number of chips of the third layer of chips is larger than that of the first layer of chips such that the third copper layer is formed to have a greater thickness than the first copper layer.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
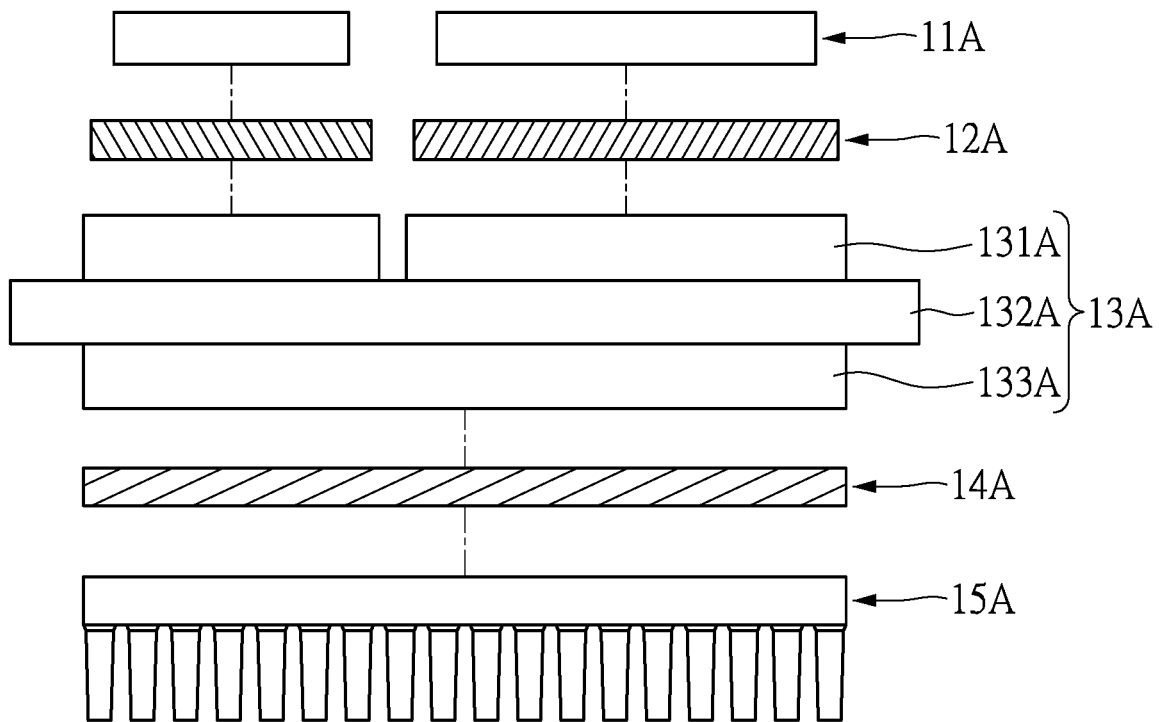
FIG. 1 is an exploded side schematic view illustrating a conventional IGBT heat dissipation structure.
Figure 2:
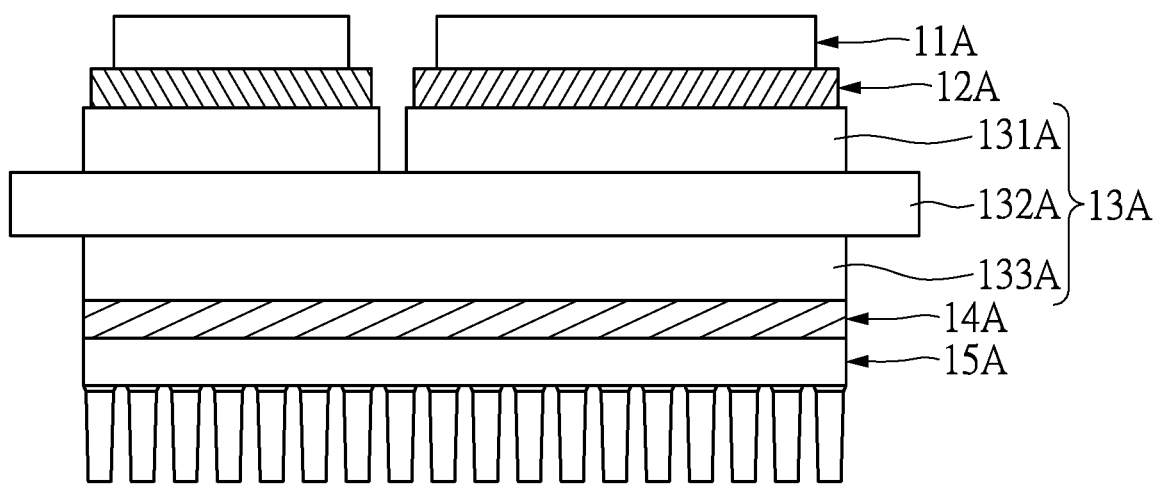
FIG. 2 is a side schematic view illustrating a conventional IGBT heat dissipation structure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 3:
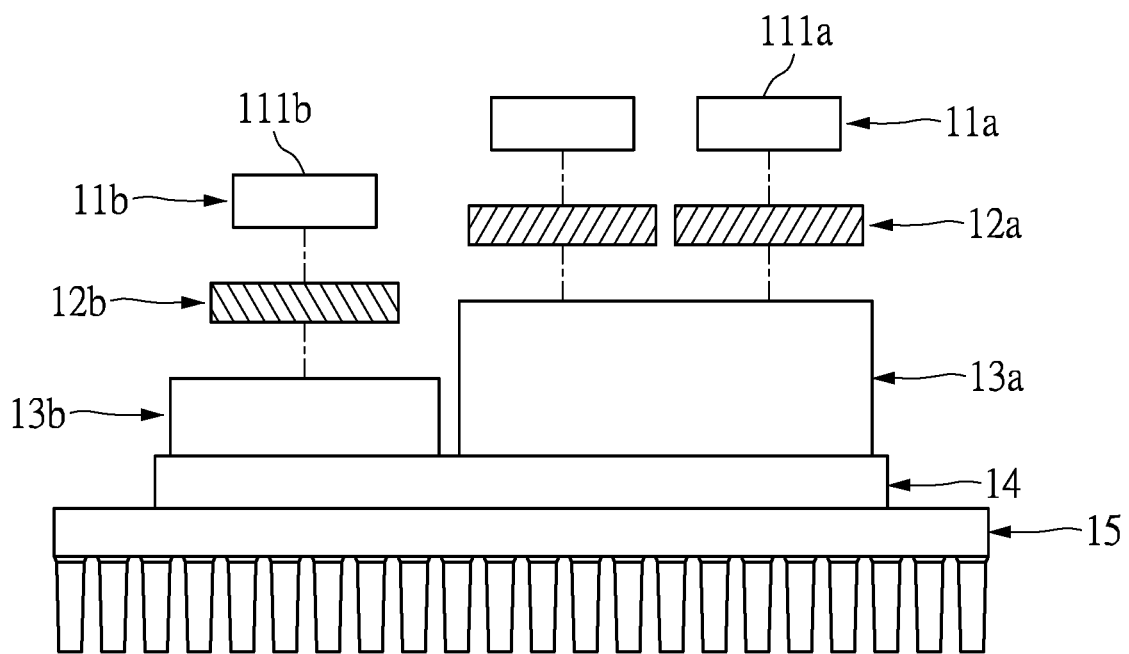
FIG. 3 is an exploded side schematic view illustrating an IGBT heat dissipation structure of the present disclosure.
Figure 4:
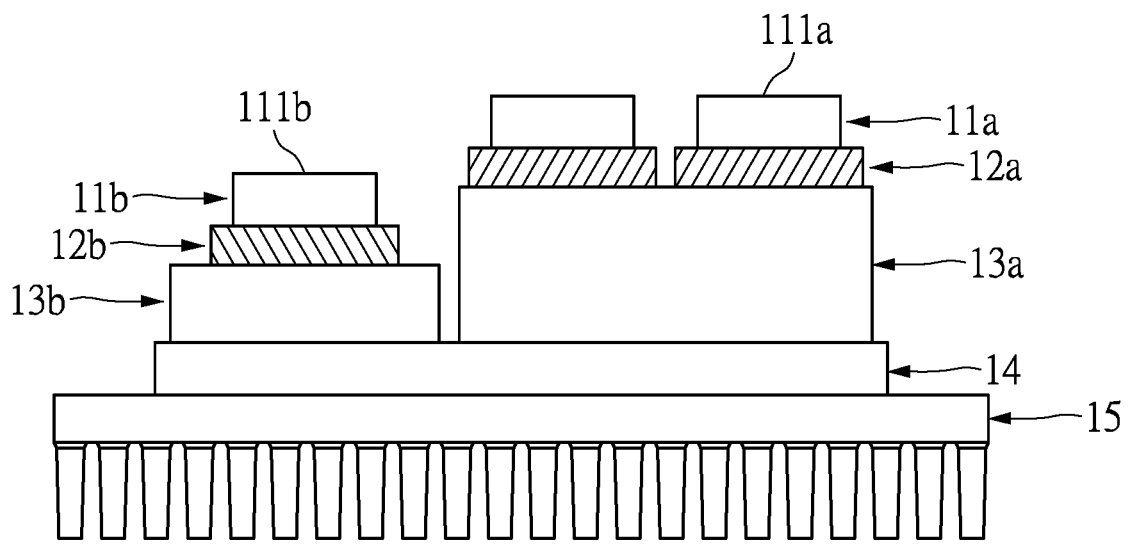
FIG. 4 is a side schematic view illustrating the IGBT heat dissipation structure of the present disclosure.
Figure 5:
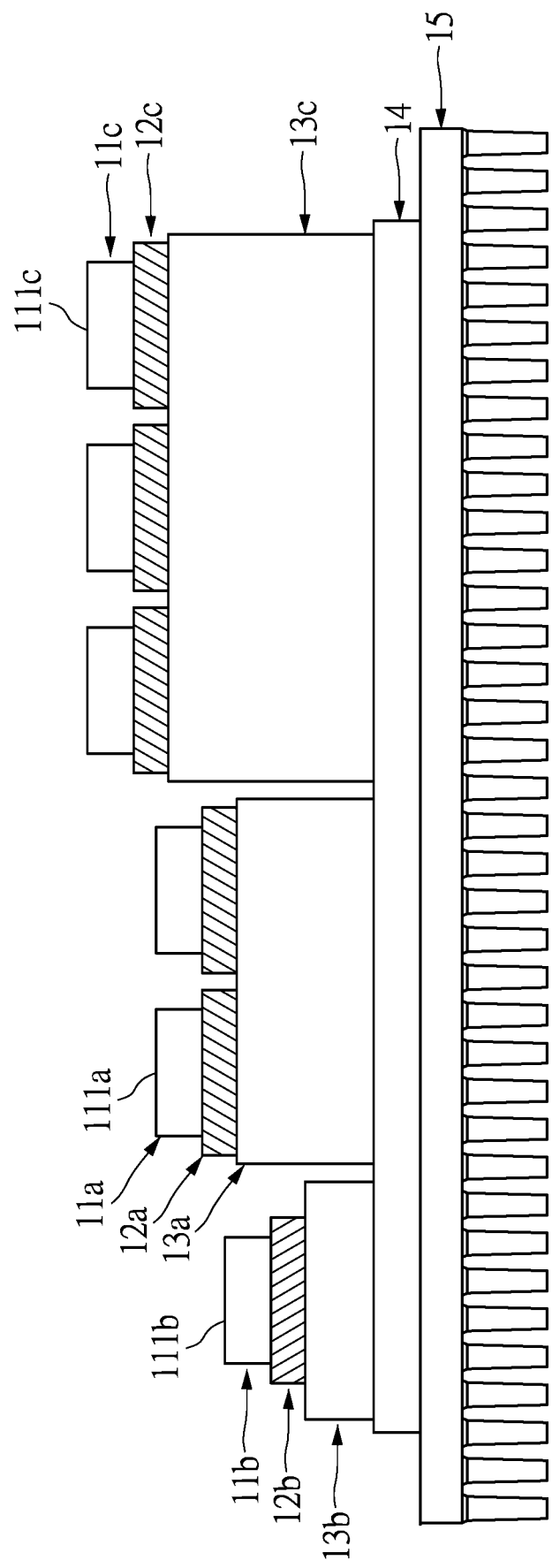
FIG. 5 is a side schematic view illustrating another IGBT heat dissipation structure of the present disclosure.

Referring to FIG. 3 to FIG. 5, the present disclosure provides an IGBT module with a heat dissipation structure having copper layers of different thicknesses. As shown in FIG. 3 to FIG. 5, the IGBT module with a heat dissipation structure having copper layers of different thicknesses in accordance with the present disclosure includes a first layer 11a of chips, a second layer 11b of chips, a first bonding layer 12a, a second bonding layer 12b, a first copper layer 13a, a second copper layer 13b, a thermally-conductive and electrically-insulating layer 14, and a heat dissipation layer 15.

The thermally-conductive and electrically-insulating layer 14 is disposed on the heat dissipation layer 15. The heat dissipation layer 15 can be a heat sink or a heat dissipation metal plate, but is not limited thereto. The thermally-conductive and electrically-insulating layer 14 is composed of polymer composite material and can achieve the effects of insulation, heat conduction and bonding. Therefore, compared to a conventional IGBT module with a heat dissipation structure that requires a solder layer to form a connection between the DBC substrate and the heat dissipation layer, the structure in accordance with the present disclosure does not need a solder layer but instead directly forms the thermally-conductive and electrically-insulating layer 14 on the surface of the heat dissipation layer 15. In this way, the heat conduction performance will not be affected by the problems of empty soldering and the interface impedance of the solder layer, and an insulation failure caused by the sputtering phenomenon of the soldering will not occur.

In detail, the thermally-conductive and electrically-insulating layer 14 may be an epoxy-based composite. Furthermore, the thermally-conductive and electrically-insulating layer 14 may include at least one of the following fillers: alumina, aluminum nitride, silicon nitride, silicon carbide, or boron nitride. In other embodiments, the thermally-conductive and electrically-insulating layer 14 may be composed of a polyimide-based composite or a PP-based composite. Moreover, the thermally-conductive and electrically-insulating layer 14 may be bonded onto the heat dissipation layer 15 by screen-printing or hot-pressing.

In the present embodiment, the thermally-conductive and electrically-insulating layer 14 has a thickness of about 20-200 μm, but preferably 100 μm, to achieve better insulation and heat conduction.

The first copper layer 13a and the second copper layer 13b are disposed on the thermally-conductive and electrically-insulating layer 14 at intervals. The thermal-conductive and electrically-insulating layer 14 can be disposed between the first and second copper layers 13a, 13b and the heat dissipation layer 15 to create insulation there-between, and the first and second copper layers 13a, 13b can conduct heat to the heat dissipation layer 15 through the thermal-conductive and electrically-insulating layer 14.

The first copper layer 13a and the second copper layer 13b may each be a thick copper block, and are formed on the thermally-conductive and electrically-insulating layer 14 by hot-pressing.

The first bonding layer 12a and the second bonding layer 12b are disposed on the first copper layer 13a and the second copper layer 13b, respectively. Furthermore, the first layer 11a of chips and the second layer 11b of chips are disposed on the first bonding layer 12a and the second bonding layer 12b, respectively. The first bonding layer 12a and the second bonding layer 12b may each be, but not limited to, a tin bonding layer, a sintered silver layer, or the like.

In the present embodiment, the first layer 11a of chips may include two IGBT chips 111a, and the second layer 11b of chips may include an IGBT chip 111b. That is, the number of chips of the first layer 11a of chips can be larger than that of the second layer 11b of chips, so that the amount of heat generated by the first layer 11a of chips is greater than that generated by the second layer 11b of chips. Therefore, the thickness of the first copper layer 13a is arranged to be greater than that of the second copper layer 13b. Furthermore, the thickness of the first copper layer 13a may be greater than 1000 μm to significantly improve uniformity of heat dissipation and overall efficiency of heat conduction, and the thickness of the second copper layer 13b may be between 200 μm and 1000 μm. In this way, in addition to improving the uniformity of heat dissipation, the cost of copper materials can also be greatly reduced.

To meet different design requirements, the IGBT chip 111b of the second layer 11b of chips can be replaced with a diode chip with smaller heat generation. In addition, one of the IGBT chips 111a of the first layer 11a of chips may also be replaced with a diode chip with smaller heat generation.

The width of the first copper layer 13a is greater than that of the second copper layer 13b, and the width of the first copper layer 13a and the second copper layer 13b may increase as the number of chips increases.

Referring to FIG. 5, the present disclosure provides another IGBT module with a heat dissipation structure having copper layers of different thicknesses. As shown in FIG. 5, the IGBT module with a heat dissipation structure having copper layers of different thicknesses in accordance with the present disclosure further includes a third layer 11c of chips, a third bonding layer 12c, and a third copper layer 13c.

The third copper layer 13c, the first copper layer 13a and the second copper layer 13b are disposed on the thermally-conductive and electrically-insulating layer 14 at intervals. The third bonding layer 12c is disposed on the third copper layer 13c. The third layer 11c of chips is disposed on the third bonding layer 12c.

In the present embodiment, the number of chips of the third layer 11c of chips can be larger than that of the first layer 11a of chips, and the number of chips of the first layer 11a of chips can be larger than that of the second layer 11b of chips, so that the amount of heat generated by the third layer 11c of chips is greater than that generated by the first layer 11a of chips, and the amount of heat generated by the first layer 11a of chips is greater than that generated by the second layer 11b of chips. Therefore, the thickness of the third copper layer 13c is arranged to be greater than that of the first copper layer 13a, and the thickness of the first copper layer 13a is arranged to be greater than that of the second copper layer 13b.

In summary, the present disclosure provides an IGBT module with a heat dissipation structure having copper layers of different thicknesses. the thermally-conductive and electrically-insulating layer 14 is disposed between the copper layers and the heat dissipation layer 15, so that the heat generated by the IGBT chips can be rapidly and uniformly transferred to the heat dissipation fins of the entire heat dissipation layer 15 via the copper layers 13 and the thermally-conductive and electrically-insulating layer 14. Compared with the DBC substrate of the conventional IGBT heat dissipation structure, the IGBT heat dissipation structure in accordance with the present disclosure can simultaneously achieve the advantages of the uniformity of heat dissipation of the copper layer and the insulation and thermal conductivity of the thermally-conductive and electrically-insulating layer. The thermally-conductive and electrically-insulating layer 14 is formed directly on the surface of the heat dissipation layer 15 without having to go through a solder layer, so that the heat conduction performance will not be affected by the problems of empty soldering and the interface impedance of the solder layer, and the insulation failure caused by the sputtering phenomenon of the soldering will not occur. As such, the heat dissipation layer 15 can exert the maximum heat absorption and heat dissipation performance. Furthermore, through the arrangement of different copper thicknesses, the chip layer having a larger number of chips and generating a larger amount of heat can be disposed on the copper layer having a greater copper thickness. As such, the uniformity of heat dissipation and the overall efficiency of heat conduction can be significantly improved, and the chip layer having a smaller number of chips and smaller heat generation can be disposed on the copper layer having a thin copper thickness, so that the cost of copper materials can be greatly reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An IGBT module with a heat dissipation structure, comprising: a first layer of chips, a second layer of chips, a first bonding layer, a second bonding layer, a first copper layer, a second copper layer, a thermally-conductive and electrically-insulating layer, and a heat dissipation layer; wherein, the thermally-conductive and electrically-insulating is disposed on the heat dissipation layer, the first copper layer and the second copper layer are disposed on the thermally-conductive and electrically-insulating layer at intervals, the first bonding layer and the second bonding layer are disposed on the first copper layer and the second copper layer, respectively, the first layer of chips and the second layer of chips are disposed on the first bonding layer and the second bonding layer, respectively; wherein, number of chips of the first layer of chips is larger than that of the second layer of chips and an amount of heat generated by the first layer of chips is greater than that generated by the second layer of chips such that the first copper layer has a greater thickness than the second copper layer; wherein, the thermally-conductive and electrically-insulating layer is a polymer composite material filled with ceramic fillers; wherein, the thermally-conductive and electrically-insulating layer has a thickness of 60-200 μm; and wherein, the first copper layer has a thickness greater than 1000 μm.

2. The IGBT module with the heat dissipation structure according to claim 1, wherein the second copper layer has a thickness of 200-1000 μm.

3. The IGBT module with the heat dissipation structure according to claim 1, further comprising: a third layer of chips, a third bonding layer and a third copper layer; wherein the third copper layer, the first copper layer and the second copper layer are disposed on the thermally-conductive and electrically-insulating layer at intervals, the third bonding layer is disposed on the third copper layer, and the third layer of chips is disposed on the third bonding layer; and wherein number of chips of the third layer of chips is larger than that of the first layer of chips such that the third copper layer has a greater thickness than the first copper layer.

* * * * *